(12) United States Patent
Yu et al.

(10) Patent No.: US 9,496,014 B2
(45) Date of Patent: Nov. 15, 2016

(54) RANDOM ACCESS MEMORY AND MEMORY ACCESS METHOD THEREOF

(71) Applicant: M31 Technology Corporation, Hsinchu County (TW)

(72) Inventors: David C. Yu, Taoyuan County (TW); Nan-Chun Lien, Taipei (TW)

(73) Assignee: M31 Technology Corporation, Hsinchu County (TW)

( * ) Notice: Subject to any disclaimer, the term of this patent is extended or adjusted under 35 U.S.C. 154(b) by 0 days.

(21) Appl. No.: 14/721,884

(22) Filed: May 26, 2015

(65) Prior Publication Data

US 2016/0232955 A1    Aug. 11, 2016

(30) Foreign Application Priority Data

Feb. 6, 2015  (TW) .............................. 104104171 A (51) Int. Cl.
| | |
|---|---|
| *G11C 11/34* | (2006.01) |
| *G11C 8/08* | (2006.01) |
| *G11C 7/22* | (2006.01) |
| *G11C 11/418* | (2006.01) |

(52) U.S. Cl.
CPC . *G11C 8/08* (2013.01); *G11C 7/22* (2013.01); *G11C 11/418* (2013.01)

(58) Field of Classification Search
CPC .............. G11C 8/08; G11C 8/14; G11C 8/18
USPC ....................................... 365/185.23, 230.01
See application file for complete search history.

(56) References Cited

U.S. PATENT DOCUMENTS

| | | | | |
|---|---|---|---|---|
| 6,111,789 A | * | 8/2000 | Choi ...................... | G11C 16/12 365/185.22 |
| 8,451,670 B2 | | 5/2013 | Kolar et al. | |
| 2006/0120134 A1 | * | 6/2006 | Watanabe ............... | G11C 11/22 365/145 |
| 2008/0253172 A1 | * | 10/2008 | Yamagami ............... | G11C 8/08 365/154 |
| 2012/0033522 A1 | | 2/2012 | Chuang et al. | |
| 2012/0087198 A1 | | 4/2012 | Nii et al. | |
| 2012/0106237 A1 | * | 5/2012 | Dengler ................. | G11C 5/145 365/154 |
| 2012/0155194 A1 | | 6/2012 | Chong et al. | |
| 2012/0170390 A1 | | 7/2012 | Idgunji et al. | |
| 2012/0307574 A1 | | 12/2012 | Cheng et al. | |
| 2013/0308407 A1 | | 11/2013 | Shyanmugam et al. | |
| 2014/0022835 A1 | | 1/2014 | Hold et al. | |

* cited by examiner

*Primary Examiner* — Han Yang
(74) *Attorney, Agent, or Firm* — Winston Hsu; Scott Margo (57) ABSTRACT

The present invention discloses a random access memory and the memory access method thereof capable of avoiding read disturbance and increasing reading speed. An embodiment of the said random access memory comprises: a word line; a word line driving unit, coupled to the word line, operable to receive an access control signal to generate a word line enablement voltage; a voltage adjusting unit including a switch and a capacitor in which the switch is coupled to the word line and operable to receive a control signal to determine a conduction state of the switch itself and the capacitor is coupled to the switch and operable to adjust a voltage level of the word line enablement voltage according to the conduction state; and a memory unit, coupled to the word line, operable to be enabled according to the word line enablement voltage.

14 Claims, 10 Drawing Sheets

RANDOM ACCESS MEMORY AND MEMORY ACCESS METHOD THEREOF

BACKGROUND OF THE INVENTION

1. Field of the Invention

The present invention relates to a random access memory and a memory access method, especially to a random access memory and a memory access method using a switch module and a capacitor to flexibly adjust the word line enablement voltage of a word line and thereby realize the confinement to a word line enablement mechanism.

2. Description of Related Art

Generally speaking, a conventional random access memory includes a memory unit array having a plurality of memory rows. Each memory row has a plurality of memory units, and each of the memory units is associated and coupled with a word line. The voltage of each word line is controlled by a word line driver in connection with the said word line. Inside each memory unit is set a latch module and a gate-controlled transistor functioning as a switch. The said latch module has two storage nodes, and the gate, source and drain terminals of the gate-controlled transistor are respectively coupled to the connected word line, one of the storage nodes and a connected bit line.

When reading data from a memory unit, the connected bit line will be pre-charged to a high voltage level, and the gate-controlled transistor of the said memory unit will be enabled to make the connected storage node be coupled with the connected bit line. If the voltage of the storage node is a low voltage indicating logic 0, the bit line will be discharged from the original high voltage level to a low voltage level. However, an inversion transistor inside the gate-controlled transistor operable to pull down voltage acts as a voltage-dividing circuit or a coupling path in which the voltage-dividing circuit may make the voltage of the storage node in association with logic 0 increase and become a read disturbance voltage. For instance, if the resistance of the gate-controlled transistor when being turned on is lower than the resistance of the inversion transistor in the latch module of the memory unit for pulling down voltage, the read disturbance voltage of the storage node will tend to increase to exceed the inversion threshold voltage of another inverter in the latch module, which will lead to the data latched by the latch module being inverted or flipped unnecessarily, that is to say the low voltage of the storage node indicating logic 0 being wrongly converted into the high voltage indicating logic 1. In addition, the voltage variation of the word line driver may be coupled to the connected storage node through the connected word line, the gate-controlled transistor and the parasitic capacitance path of the transistor in the latch module and then result in a disturbance voltage. The above-described problem is known as read disturbance.

One of the prior arts for the reduction in read disturbance is realized through reducing the word line enablement voltage. However, the problem of this prior art is that the rate of reading data from the memory unit is slowed down obviously due to the decrease of the word line enablement voltage while this enablement voltage or the data reading rate is not adjustable.

SUMMARY OF THE INVENTION

In consideration of the problems of the prior art, an object of the present invention is to provide a random access memory and a memory access method capable of avoiding read disturbance and preventing the rate of reading data from slowing down unduly.

The present invention discloses a random access memory with a reliable read access method keeping the speed of reading under an acceptable condition. An embodiment of this random access memory comprises: a first word line; a first word line driving unit, coupled to the first word line, operable to receive a first access control signal and thereby generate a first word line enablement voltage; a first voltage adjusting unit; and a first memory unit, coupled to the first word line, operable to be enabled in accordance with the first word line enablement voltage. The said first voltage adjusting unit includes: a first switch module, coupled to the first word line, operable to receive a first control signal and thereby determine a conduction state of the first switch module; and a capacitor, coupled to the first switch module, operable to adjust a voltage level of the first word line enablement voltage according to the conduction state of the first switch module.

Another embodiment of the random access comprises: a word line; a word line driving unit which is coupled to the word line and operable to receive an access control signal to thereby generate a word line enablement voltage; and a memory unit, coupled to the word line, operable to be enabled according to the word line enablement voltage. The said word line driving unit includes a plurality of first p-channel MOSFETs connected in parallel while one of the plurality of p-channel MOSFETs is operable to receive the access control signal and the others of the plurality of p-channel MOSFETs are operable to receive a plurality of control signals respectively to be turned on or off respectively, so as to control a slew rate of the word line enablement voltage.

The present invention also discloses a memory access method. An embodiment of this method comprises the following steps: receiving a first access control signal and thereby generating a first word line enablement voltage; receiving a first control signal and thereby controlling a first switch module which is coupled with a capacitor; adjusting the voltage level of the first word line enablement voltage with the capacitor according to a conduction state of the first switch module; and enabling a first memory unit according to the first word line enablement voltage, wherein the first word line enablement voltage, the first switch module and the first memory unit are associated with a first word line.

The random access memory and memory access method of the present invention make confinement to a word line enablement mechanism, and thereby adjust a word line enablement voltage for enabling a gate-controlled transistor in a multistage or flexible way. Compared with the prior art, the present invention can adjust the word line enablement voltage in the multistage or flexible way, maintain the rate of reading data from memory while giving consideration to the reduction in read disturbance, and thereby prevent the reading rate from improperly slowing down due to the decrease of the word line enablement voltage.

These and other objectives of the present invention will no doubt become obvious to those of ordinary skill in the art after reading the following detailed description of the preferred embodiments that are illustrated in the various figures and drawings.

BRIEF DESCRIPTION OF THE DRAWINGS

FIG. 3 illustrates an exemplary implementation of the inverter in FIG. 2a.

FIG. 6b illustrates a voltage wave diagram of the word line enablement voltage in FIG. 6a.

FIG. 7 illustrates an exemplary implementation of the random access memory in FIG. 6a.

DETAILED DESCRIPTION OF THE PREFERRED EMBODIMENTS

The present disclosure comprises a random access memory and a memory access method, capable of reducing read disturbance and keeping the rate of reading data from memories acceptable, and thereby prevents the reading rate from slowing down unduly as the word line enablement voltage gets lower.

Provided that an alternative element or step is available and reasonable, people of ordinary skill in the art can use such the element or step similar or equivalent to that described in this specification to carry out the present invention. More specifically, the following embodiments are just exemplary, not limitative to the scope of the present invention.

Figure 1:
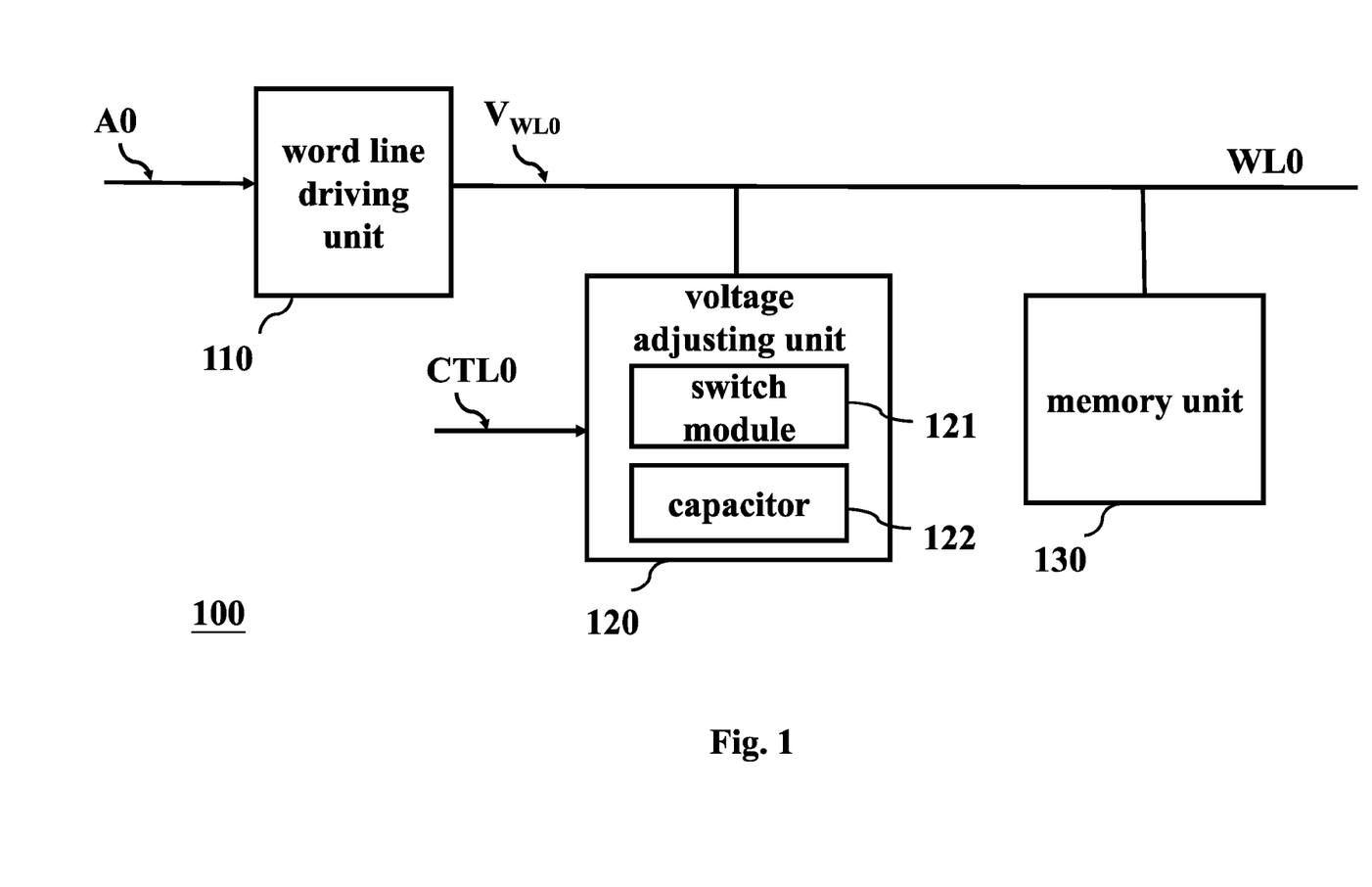
FIG. 1 illustrates an embodiment of the random access memory of the present invention.

Refer to FIG. 1, which illustrates an embodiment of the random access memory of the present invention. The random access memory 100 in this embodiment comprises: a word line WL0, a word line driving unit 110, a voltage adjusting unit 120 and a memory unit 130. The voltage adjusting unit 120 includes a switch module 121 and a capacitor 122. Some or all of the above-mentioned circuits could be integrated into one integrated circuit or be independent circuit(s).

When the memory unit 130 in connection with the word line WL0 is going to be accessed, the word line driving unit 110 will receive an access control signal A0 operable to trigger the word line driving unit 110 to generate a word line enablement voltage $V_{WL0}$. This word line enablement voltage $V_{WL0}$ is the voltage of the word line WL0, and the word line driving unit 110 is coupled with the word line WL0. As a result, the word line enablement voltage $V_{WL0}$ from the word line driving unit 110 can be transmitted through the word line WL0. In an embodiment, the said access control signal A0 is a decoded signal generated by a word address pre-decoder (not shown in the figures). The voltage adjusting unit 120 here is also coupled with the word line WL0, and includes the aforementioned switch module 121 and capacitor 122 which are coupled with each other. The switch module 121 receives a control signal CTL0 to be turned on or off accordingly, that is to say to determine a conduction state of the switch module 121 itself, so that the voltage level of the word line enablement voltage $V_{WL0}$ can be adjusted according to the conduction state of the switch module 121 and the charged/discharged state of the capacitor 122. The memory unit 130 is coupled with the word line WL0, and operable to be enabled by the word line enablement voltage $V_{WL0}$ after the voltage $V_{WL0}$ is adjusted by the voltage adjusting unit 120.

Figure 2A:
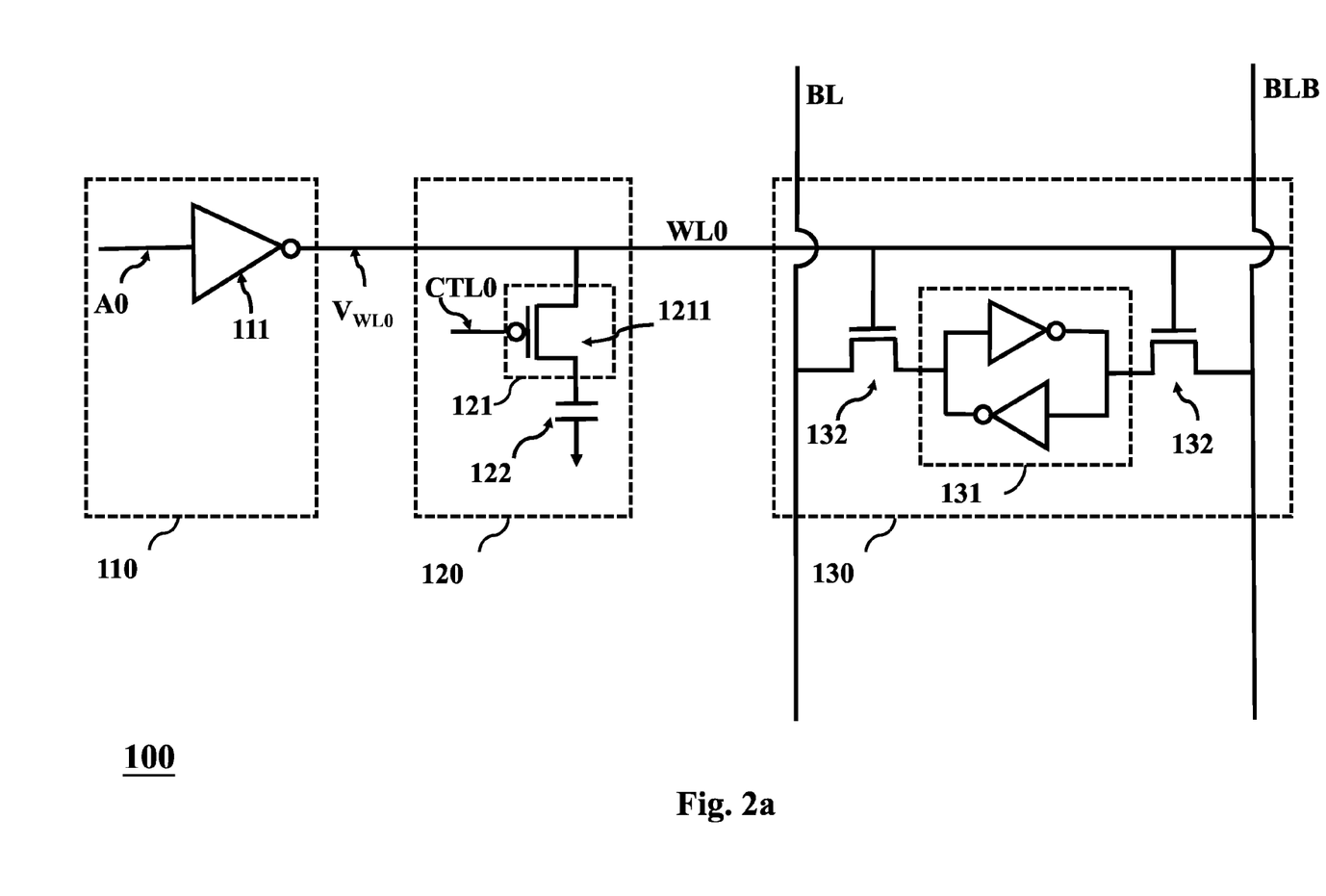
FIG. 2a illustrates an exemplary implementation of the random access memory in FIG. 1.

Refer to FIG. 2a, which illustrates an exemplary implementation of the random access memory 100 of FIG. 1. As shown in FIG. 2a, the random access memory 100 further comprises a bit line BL and a bit line BLB; the word line driving unit 110 includes an inverter 111; the switch module 121 includes a p-channel MOSFET (Metal-Oxide-Semiconductor Field Effect Transistor) 1211; and the memory unit 130 includes a latch module 131 and a plurality of gate-controlled transistors 132. The mentioned word line driving unit 110, the switch module 121 and the memory unit 130 are all coupled to the word line WL0, and some or all of these circuits could be integrated into one integrated circuit or be independent circuit(s)

Figure 3:
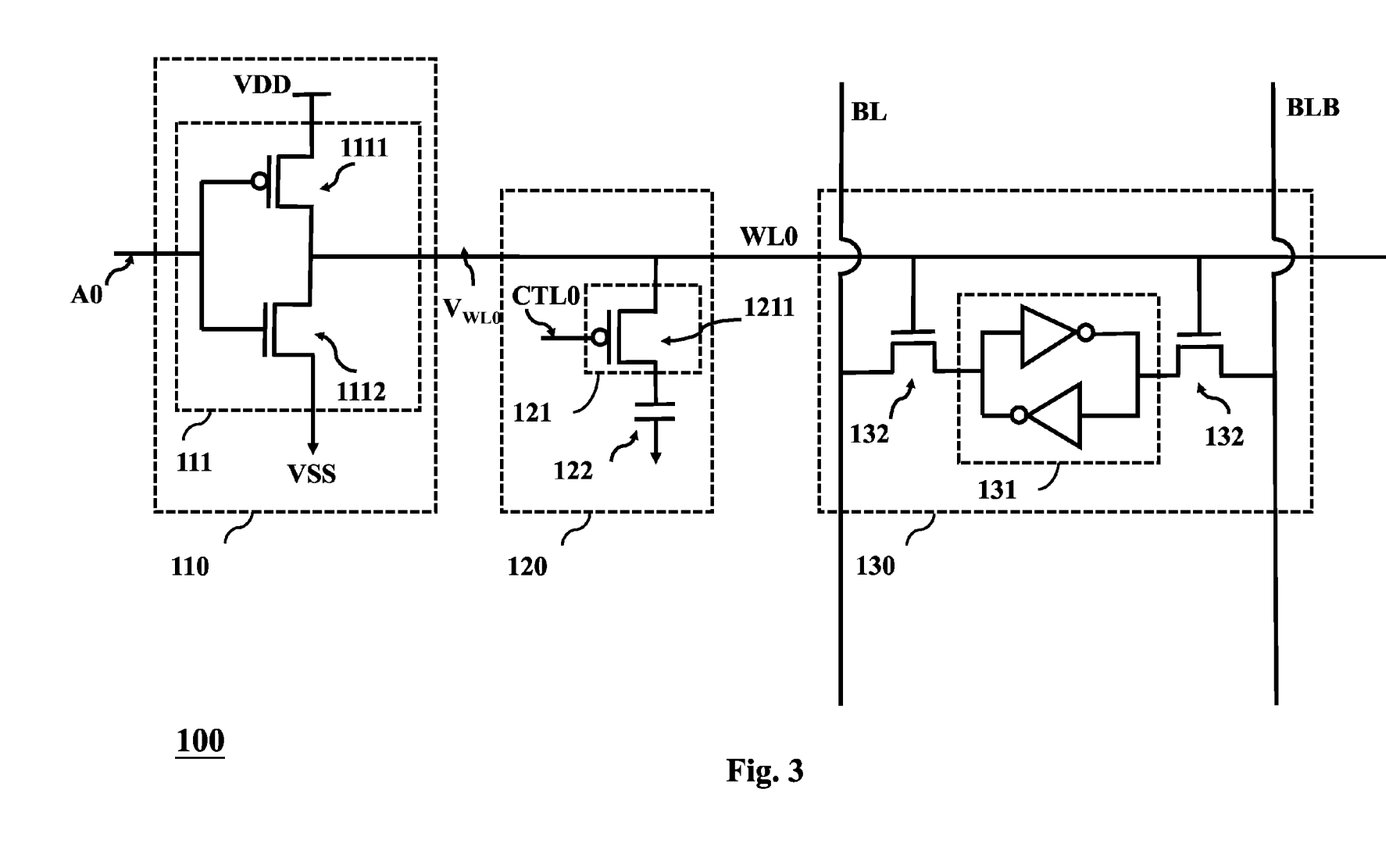

Refer to FIG. 2a again, which can also explain the operation of the random access memory 100 of the present embodiment. In this embodiment, when the memory unit 130 in connection with the word line WL0, the bit line BL and the bit line BLB is going to be read, the bit line BL and the bit line BLB are pre-charged to a high voltage level; an input end of the inverter 111 of the word line driving unit 110 receives the aforementioned access control signal A0 which triggers the inverter 111 to generate the aforementioned word line enablement voltage $V_{WL0}$; and an output end of the inverter 111 outputs the word line enablement voltage $V_{WL0}$ which is then transmitted through the word line WL0. An embodiment of the inverter 111 includes a p-channel MOSFET 1111 and an n-channel MOSFET 1112 (as shown in FIG. 3) in which the source terminal of the p-channel MOSFET 1111 is coupled with a voltage source VDD while the source terminal of the n-channel MOSFET 1112 is coupled with a voltage source VSS whose voltage level is lower than the voltage level of the voltage source VDD. In addition, the gate terminal of the p-channel MOSFET 1111 and the gate terminal of the n-channel MOSFET 1112 are coupled with each other to be an input end for receiving the access control signal A0, and the drain terminal of the p-channel MOSFET 1111 and the drain terminal of the n-channel MOSFET are coupled with each other to be an output end for outputting the word line enablement voltage $V_{WL0}$.

Figure 2B:
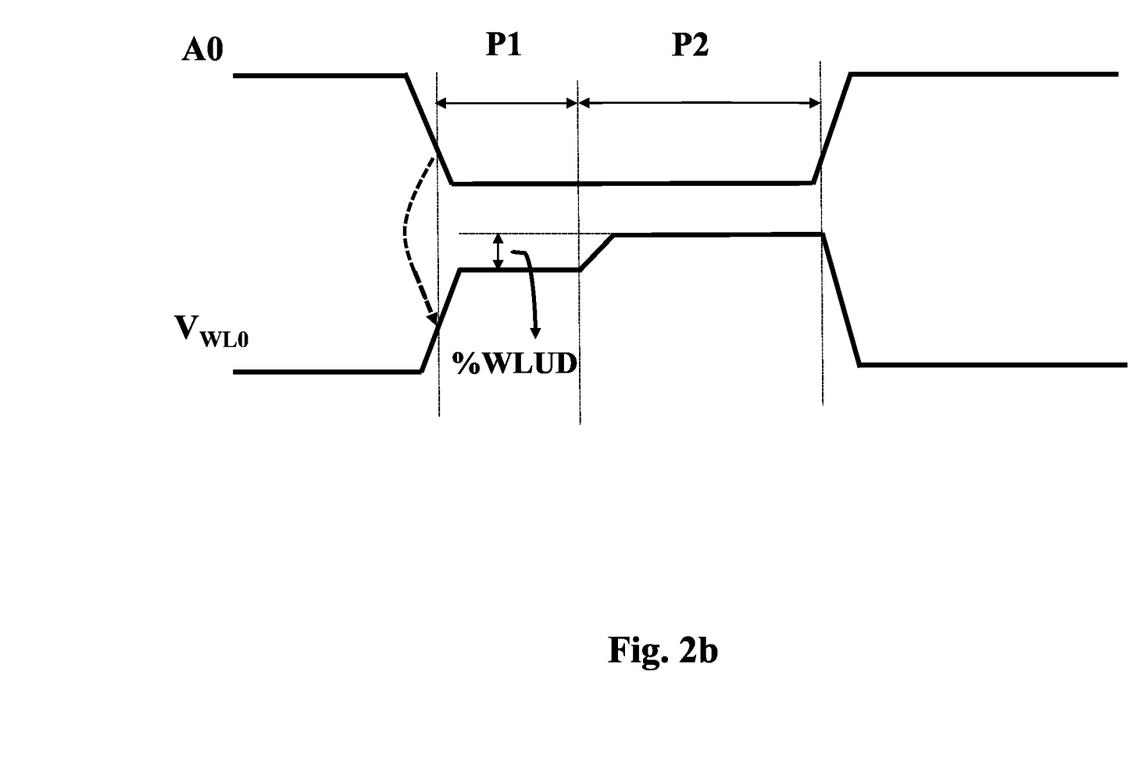
FIG. 2b illustrates a timing diagram of the signals of the random access memory in FIG. 2.

Refer to FIG. 2a and FIG. 2b. FIG. 2b illustrates a timing diagram of the signals A0, $V_{WL0}$ of the random access memory 100 in FIG. 2a. As shown in the figures, the gate terminal of the p-channel MOSFET 1211 of the switch module 121 receives a control signal CTL0. When the control signal CTL0 is a low voltage signal, the p-channel MOSFET 1211 is turned on; meanwhile, since the capacitor 122 is coupled to the drain terminal of the p-channel MOSFET, the capacitor 122 is coupled to the word line WL0 through the turned-on p-channel MOSFET 1211, and the word line enablement voltage $V_{WL0}$ and the rising speed thereof are consequently confined by the capacitor 122 and the switch module 121. Furthermore, through the control over the access control signal A0 or the connection between the word line driving unit 110 and the word line WL0, the word line enablement voltage $V_{WL0}$ can be controlled to be a specific voltage (as indicated by the period P1 in FIG. 2b). The rising speed of the voltage level of the word line enablement voltage $V_{WL0}$ and the degree of the voltage reduction % WLUD in the enablement voltage (i.e., the voltage difference between the mentioned specific voltage and a normal high voltage) can be determined or adjusted in accordance with the area or capacitance of the capacitor 122 and/or the area or resistance of the p-channel MOSFET 1211. In a preferred embodiment, the degree of the voltage reduction % WLUD the word line enablement voltage $V_{WL0}$ is below 10%; however, this is merely exemplary for understanding. Please note that the transistor type taken in this specification is illustrative rather than limitative, and other types of transistors or the combination thereof can be taken instead. Refer to FIG. 2a and FIG. 2b again. The reduced or confined word line enablement voltage $V_{WL0}$ is operable to enable the gate-controlled transistors 132 of the memory unit 130 and switch them on. These gate-controlled transistors 132 are coupled with the latch module 131 of the memory unit 130. If a storage node of the latch module 131 is kept at a low voltage level indicating logic 0, since the switched-on gate-controlled transistor 132 allow the storage node being coupled with the bit line BL, the voltage level of the bit line BL is pulled down to the low voltage level by the latch module 131 through the gate-controlled transistor 132, and thus the voltage level of the pre-charged bit line BL changes from a high voltage level indicating logic 1 to the low voltage level indicating 0. Moreover, since the word line enablement voltage $V_{WL0}$ is lowered down by the voltage reduction % WLUD because of the adjustment operation of the voltage adjusting unit 120, the conduction ability of the gate-controlled transistors 132 is therefore lowered down, which means that the equivalent resistance of the gate-controlled transistors 132 increases and consequently suppresses the voltage of the said storage node. In addition, since the rising speed of the voltage level of the word line enablement voltage $V_{WL0}$ is lowered down by the voltage adjusting unit 120, the coupling interference voltage at the storage node of the latch module 131 caused by a parasitic capacitor coupling path between the gate terminal of the gate-controlled transistor 132 and the storage node of the latch module 131 is therefore suppressed. Both the above-described mechanisms can prevent the voltage of the storage node from increasing and avoid read disturbance which will cause the logic 0 of the storage node of the latch module 131 to be wrongly flipped into logic 1, and thus achieve the purpose of confined word line driving mechanism. While achieving the purpose of reducing read disturbance, in order to prevent the rate of reading data from the memory unit 130 from improperly slowing down due to the decrease of the word line enablement voltage $V_{WL0}$ or due to the reduction in the rising speed, the p-channel MOSFET 1211 of the switch module 121 can be turned off according to the control signal CTL0 at an appropriate timing. As a result, the capacitor 122 will stop being coupled with the word line WL0 to allow the word line WL0 to be free from the restriction of the capacitor 122, or the word line enablement voltage $V_{WL0}$ will rise up (as indicated by the period P2 in FIG. 2b) through the control over the access control signal A0 or over the connection between the word line driving unit 110 and the word line WL0, so that the rate of reading data can be increased. In light of the above, the random access memory 100 of the present invention is operable to adjust the voltage level of the word line WL0 through the voltage adjusting unit 120, and thereby realize the confined word line driving mechanism while taking the rate of reading data into consideration.

In addition to the above, the switch module 121 could be a variable resistor or a circuit with a plurality of switches for the selection of resistance. The capacitor 122 could be a variable capacitor or a circuit with a plurality of capacitors for the selection of capacitance. The random access memory 100 may further comprise a detecting unit (not shown in the figures) operable to detect the data inversion of the memory unit 130 caused by read disturbance and thereby generate a detection result; therefore, the random access memory 100 is operable to determine or adjust the resistance of the switch module 121 or the capacitance of the capacitor 122 according to the detection result through a control signal, or operable to determine the length of the voltage-limited period P1 of the word line enablement voltage $V_{WL0}$ and determine the rising speed of the voltage level of the word line enablement voltage $V_{WL0}$ in accordance with the detection result.

Figure 4:
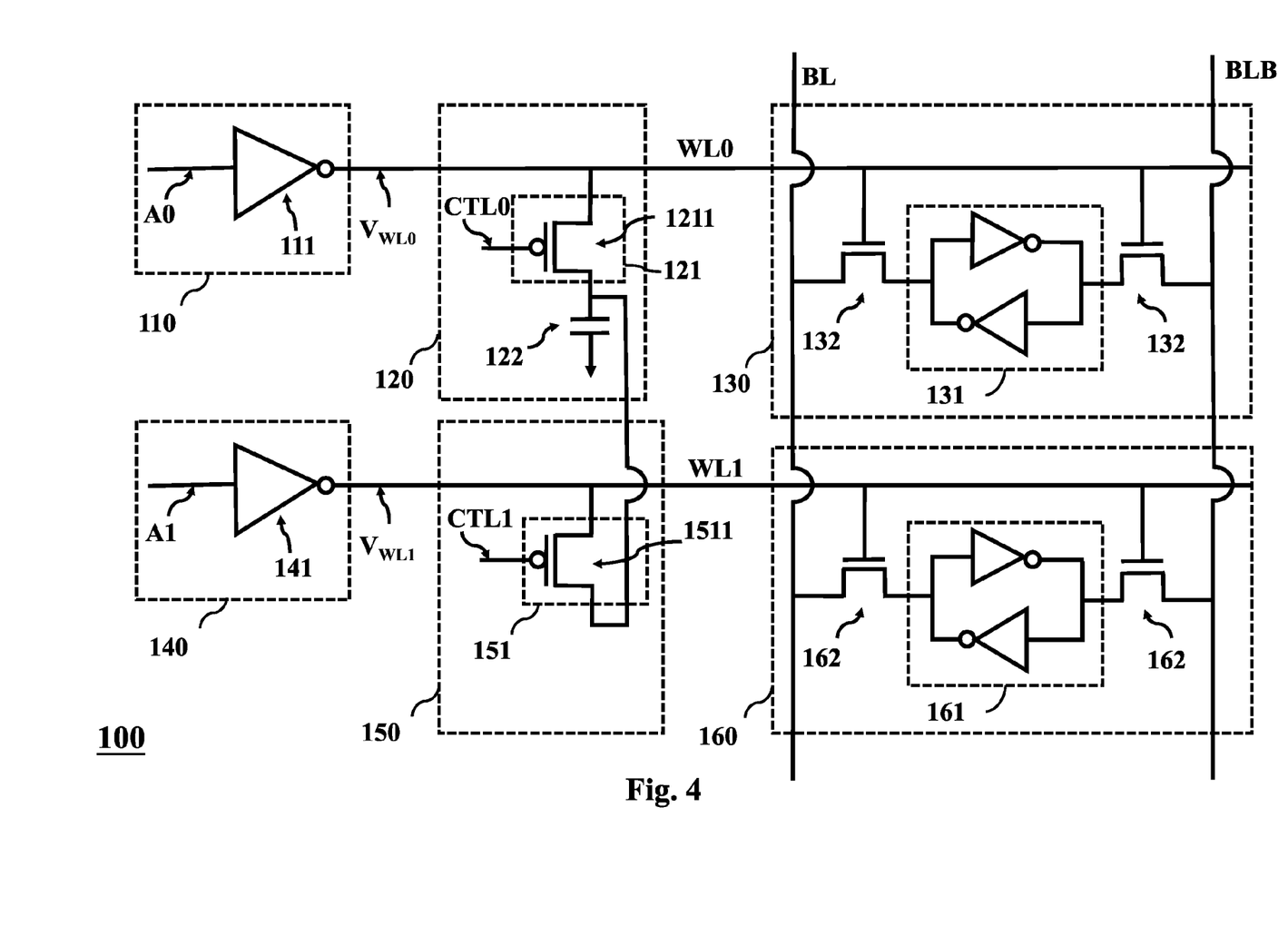
FIG. 4 illustrates an exemplary implementation of the random access memory in FIG. 1.

Refer to FIG. 4, which illustrates another exemplary implementation of the random access memory 100 in FIG. 1. As shown in FIG. 4, the random access memory 100 further comprises: a word line driving unit 140, a voltage adjusting unit 150 and a memory unit 160 in which the voltage adjusting unit 150 includes a switch module 151. The mentioned word line driving unit 140, the voltage adjusting unit 150 and the memory unit 160 are all coupled to a word line WL1, and some or all of these circuits could be integrated into one integrated circuit or be independent circuit(s).

Refer to FIG. 4 again. Since one of ordinary skill in the art can appreciate the detail and modification of the embodiment of FIG. 4 by referring to FIGS. 1 and 3 and the description thereof, repeated and redundant explanation is therefore omitted. In the mentioned voltage adjusting unit 150, the switch module 151 includes a p-channel MOSFET 1511 which is coupled with the capacitor 122 of the voltage adjusting unit 120 and operable to receive a control signal CTL1 through the gate terminal. When the control signal CTL1 is a low voltage signal, the p-channel MOSFET 1511 is turned on, and thereby the word line enablement voltage $V_{WL1}$ and the rising speed thereof are confined by the capacitor 122 and the transistor 1511, which consequently prevents the data stored in the memory unit 160 from being inverted or flipped wrongly and avoids read disturbance, and accomplishes the confined word line driving mechanism. Similarly, in order to prevent the rate of reading data from the memory unit 160 from improperly slowing down due to the voltage drop of the word line enablement voltage $V_{WL1}$ or due to the decrease of the rising speed of the enablement voltage level, the p-channel MOSFET 1511 of the switch module 151 can be turned off through the control signal CTL1 at an appropriate timing. As a result, the capacitor 122 can be decoupled from the word line enablement voltage $V_{WL1}$; then the word line enablement voltage $V_{WL1}$ can get rid of the confinement of the capacitor 122; afterwards the word line enablement voltage $V_{WL1}$ will rise up, and the rate of reading data will increase. In light of the above, the capacitor 122 is shared between the voltage adjusting unit 150 connected with the word line WL1 and the voltage adjusting unit 120 connected with the word line WL0. In general, the capacitor 122 could be shared among a plurality of voltage adjusting units connected with a plurality of word lines respectively. The random access memory 100 may further comprise a detecting unit (not shown in the figures) operable to detect the data inversion of the memory unit 130 and/or the memory unit 160 caused by read disturbance and thereby generate a detection result. Thus the random access memory 100 is operable to determine or adjust the resistance of the switch module 121 and/or the switch module 151 or the capacitance of the capacitor 122, or operable to determine the length of the voltage-limited period P1 of the word line enablement voltage(s) $V_{WL0}$ and/or $V_{WL1}$ and determine the rising speed of the voltage level(s) of the word line enablement voltage(s) $V_{WL0}$ and/or $V_{WL1}$.

Figure 5:
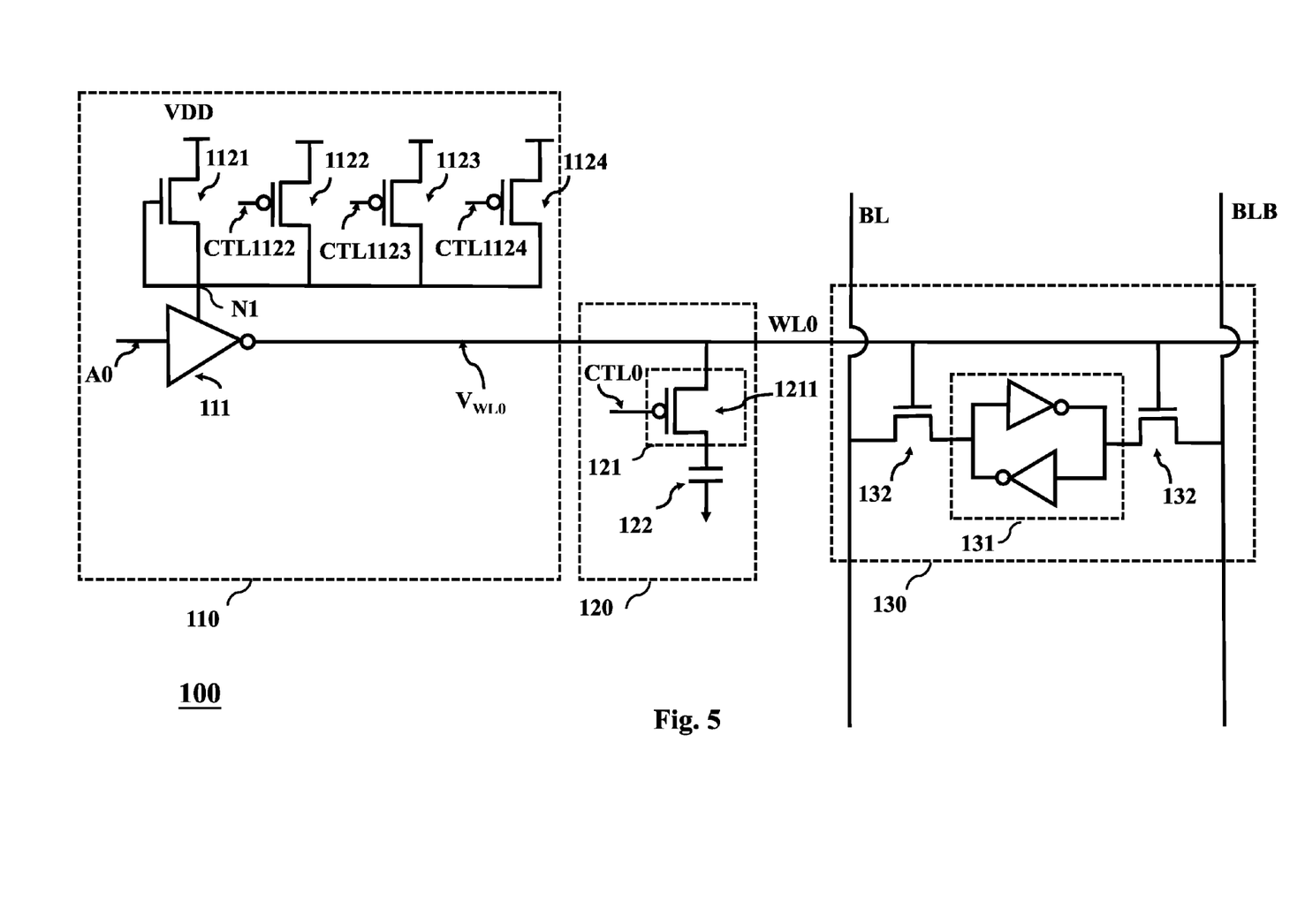
FIG. 5 illustrates an exemplary implementation of the random access memory in FIG. 1.

Refer to FIG. 5, which illustrates yet another exemplary implementation of the random access memory 100 in FIG.

1. As shown in FIG. 5, the word line driving unit 110 includes the inverter 111, and further includes: an n-channel MOSFET 1121 and a plurality of p-channel MOSFETs 1122, 1123 and 1124.

Refer to FIG. 5 again. Since one of ordinary skill in the art can appreciate the detail and modification of the embodiment of FIG. 5 by referring to FIG. 1 through FIG. 3 and the description thereof, the following description abridges repeated and redundant explanation. The drain terminal of the n-channel MOSFET 1121 of the word line driving unit 110 is coupled with a voltage source VDD, the source terminal and the gate terminal of the MOSFET 1121 are coupled with the same node N1, the source terminals of the p-channel MOSFETs 1122, 1123 and 1124 of the word line driving unit 110 are coupled with the voltage source VDD while the drain terminals of these p-channel MOSFETs 1122, 1123 and 1124 are coupled with the node N1. Accordingly, the n-channel MOSFET 1121 and the p-channel MOSFETs 1122, 1123 and 1124 are coupled in parallel between the voltage source VDD and the node N1. The node N1 is also coupled with a power input end of the inverter 111 to provide an operation voltage for the inverter 111. The p-channel MOSFETs 1122, 1123 and 1124 receive control signals CTL1122, CTL1123 and CTL1124 respectively, and these control signals CTL1122, CTL1123 and CTL1124 control the conduction states of the p-channel MOSFETs respectively to thereby determine or adjust the voltage level of the operation voltage and the word line enablement voltage $V_{WL0}$ as well. In an embodiment, the input end of the inverter 111 receives the access control signal A0 and the p-channel MOSFET 1122 receives the control signal CTL1122 of low voltage; accordingly, the p-channel MOSFET 1122 is turned on and the n-channel MOSFET 1121 is turned on consequently. In the meantime, the plurality of control signals CTL1123 and CTL 1124 are made to be high voltage signals to turn off the p-channel MOSFETs 1123 and 1124, then the operation voltage at the node N1 for the inverter 111 is kept lower relatively, and therefore the level of the word line enablement voltage $V_{WL0}$ generated by the word line driving unit 110 is decreased for the confined word line driving mechanism. Afterwards, the control signals CTL1123 and CTL1124 are made to be low voltage signals to turn on the p-channel MOSFETs 1123 and 1124, then the operation voltage at the node N1 for the inverter 111 is increased, and the voltage level of the word line enablement voltage $V_{WL0}$ generated by the word line driving unit 110 is increased consequently. In light of the above, the more the number of the turned-on p-channel MOSFETs is, the higher the voltage level of the word line enablement voltage $V_{WL0}$ is, which implies that the rate of reading data gets higher and the effect of modifying the word line enablement voltage $V_{WL0}$ flexibly is accomplished. In another embodiment, the control signals CTL1123 and CTL1124 are turned into low voltage signals one by one, so that the connected p-channel MOSFETs are turned on one after another, and the word line enablement voltage $V_{WL0}$ is increased gradually. In yet another embodiment, the control signals CTL1123 and CTL1124 are turned into low voltage signals simultaneously, so that the connected p-channel MOSFETs are turned on at the same time, and the word line enablement voltage $V_{WL0}$ is increased rapidly. Please note that the number of n-channel MOSFET and p-channel MOSFETs in this embodiment are exemplary for understanding, not limitative to the scope of the present invention. In a further embodiment, the random access memory 100 may comprise a detecting unit (not shown in the figures) operable to detect the data inversion of the memory unit 130 caused by read disturbance and thereby generate a detection result, and then the random access memory is operable to control or adjust the conduction states of the transistors 1122, 1123 and 1124 through the control signals CTL1122, CTL1123 and CTL1124 in accordance with the detection result to thereby modify the voltage level and the voltage level rising speed of the word line enablement voltage $V_{WL0}$.

Figure 6A:
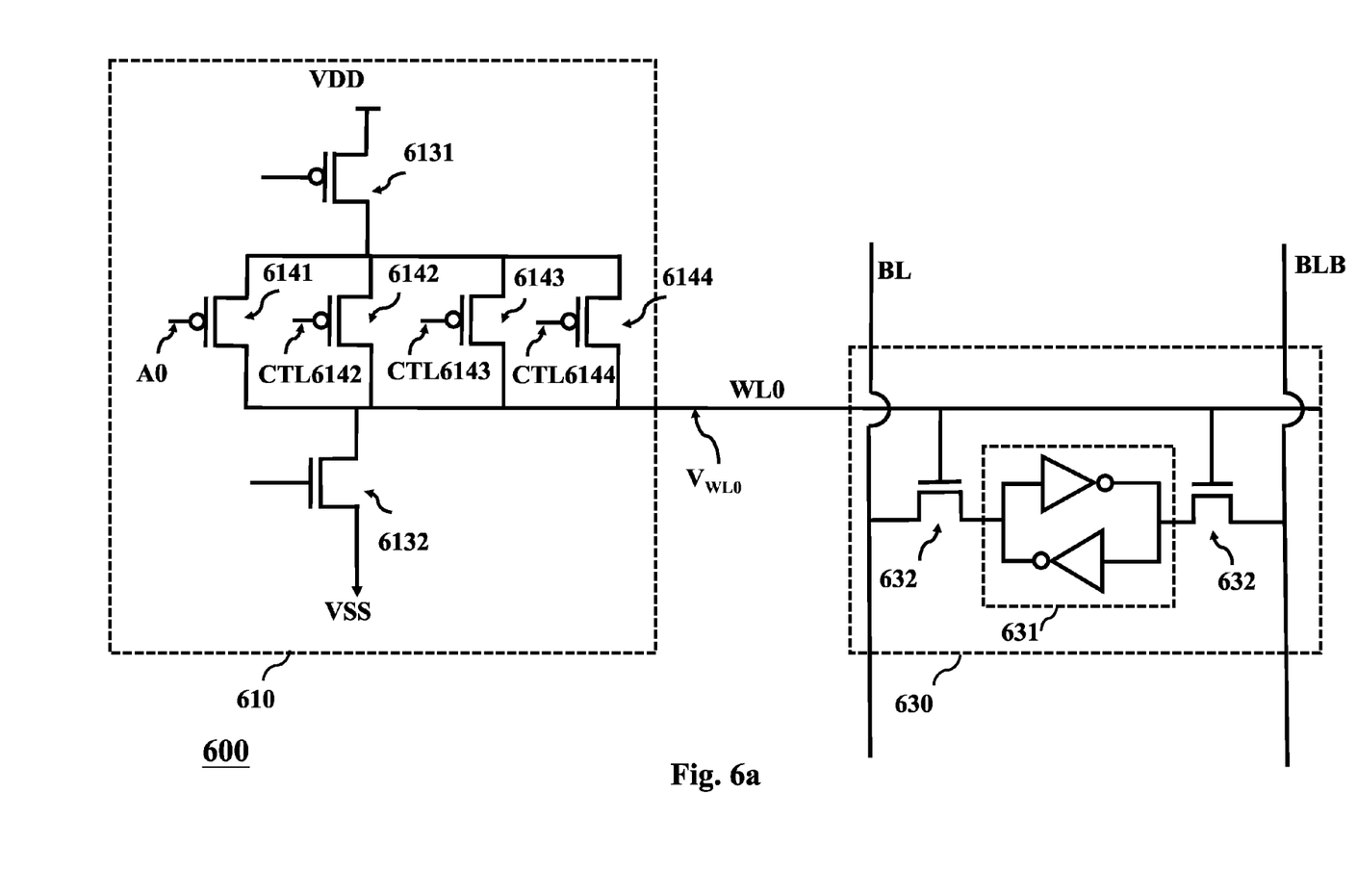
FIG. 6a illustrates an embodiment of the random access memory of the present invention.

Refer to FIG. 6a, which illustrates another embodiment of the random access memory of the present invention. As shown in FIG. 6a, the random access memory 600 comprises: a word line WL0, a word line driving unit 610 and a memory unit 630. The said word line driving unit 610 includes: a p-channel MOSFET 6131, an n-channel MOSFET 6132, and a plurality of p-channel MOSFETs 6141, 6142, 6143 and 6144. Some or all the above-mentioned circuits could be integrated into one integrated circuit or be independent circuit(s).

Refer to FIG. 6a again. The source terminal of the p-channel MOSFET 6131 of the word line driving unit 610 is coupled with a voltage source VDD, and the source terminals of the n-channel MOSFET 6132 of the word line driving unit 610 is coupled with the voltage source VSS whose voltage level is lower than the voltage level of the voltage source VDD. The source terminals of the p-channel MOSFETs 6141, 6142, 6143 and 6144 are coupled with the drain terminal of the p-channel MOSFET 6131, and the drain terminals of the p-channel MOSFETs 6141, 6142, 6143 and 6144 are coupled with the drain terminal of the n-channel MOSFET 6132, which implies that the p-channel MOSFETs 6141, 6142, 6143 and 6144 are coupled in parallel between the p-channel MOSFET 6141 and the n-channel MOSFET 6132. The p-channel MOSFET 6141 is operable to receive a control signal A0, the p-channel MOSFETs 6142, 6143 and 6144 are operable to receive control signals CTL6142, CTL6143 and CTL6144 respectively, and the control signals CTL6142, CTL6143 and CTL6144 are operable to control the conduction states of the p-channel MOSFETs 6142, 6143 and 6144 respectively to thereby adjust the rising speed or slew rate of the word line enablement voltage $V_{WL0}$. In one embodiment, the p-channel MOSFET 6141 receives the control signal A0 to be turned on and the word line driving unit 610 generates the word line enablement $V_{WL0}$ accordingly; in the meantime, the number of the turned-on p-channel MOSFET(s) among the transistors 6142, 6143 and 6144 is controlled by the control signals CTL6142, CTL6143 and CTL6144. The less the number of the turned-on p-channel MOSFET(s) among the transistors 6142, 6143 and 6144 is, the gentle the slew rate of the voltage wave of the word line enablement voltage $V_{WL0}$ is; consequently, the full swing of the voltage wave of the word line enablement voltage $V_{WL0}$ will be suppressed. On the contrary, the more the number of the turned-on p-channel MOSFET(s) among the transistors 6142, 6143 and 6144 is, the drastic the slew rate of the voltage wave of the word line enablement voltage $V_{WL0}$ is. As a result, a proper slew rate can be set through the control over the number of the turned-on p-channel MOSFET(s). As long as the voltage rising rate of the voltage wave of the word line enablement voltage $V_{WL0}$ is proper, read disturbance can be suppressed to thereby achieve the confined word line driving mechanism. In another embodiment, the random access memory 600 may further comprise a detecting unit (not shown in the figures) operable to detect the data inversion of the memory unit 630 caused by read disturbance and generate a detection result, and thus the random access memory 600 is operable to control the conduction states of the transistors 6142, 6143 and 6144 through the control signals CTL6142, CTL6143 and CTL6144 in accordance with the detection result, so as to control the voltage level and its rising speed (or slew rate) of the word line enablement voltage $V_{WL0}$.

Figure 6B:
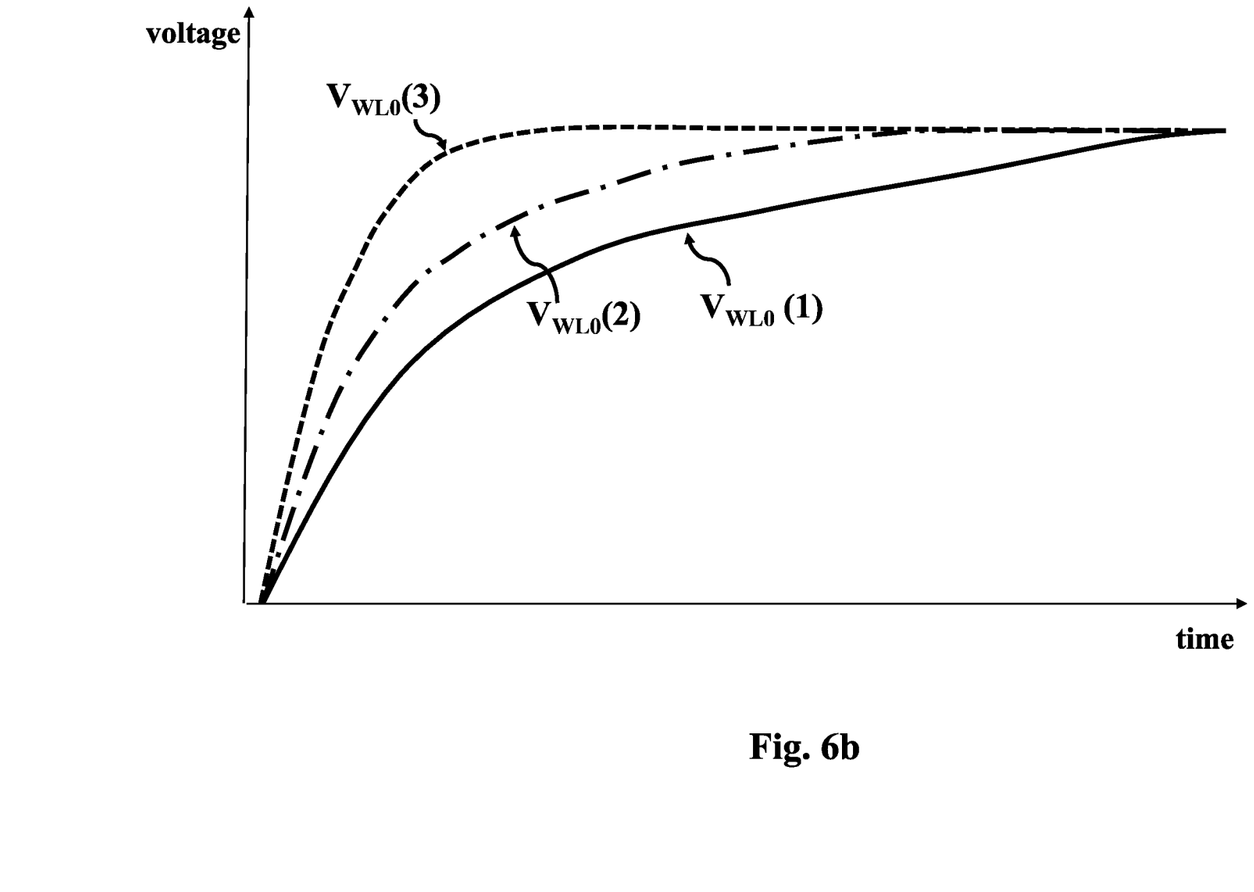
Figure 7:
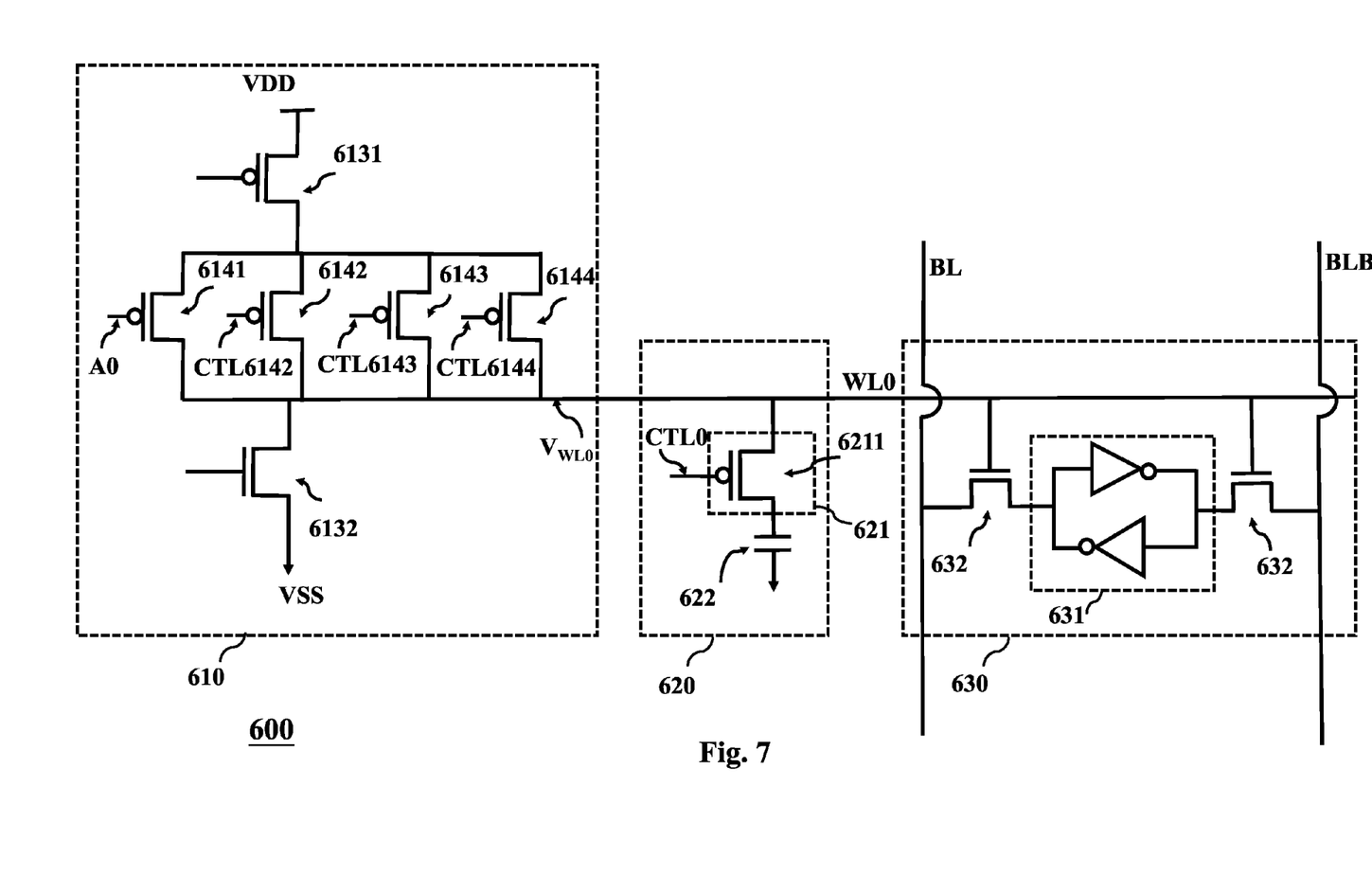

Please refer to FIG. 6a and FIG. 6b which illustrates a voltage wave diagram of the embodiment of FIG. 6a. As it is shown in the figures, when the p-channel MOSFETs 6142, 6143 and 6144 are turned off and the p-channel MOSFET 6141 is turned on, the voltage wave is represented by the solid line $V_{WL0}(1)$ whose slew rate is relatively gentle; when the p-channel MOSFETs 6141 and 6142 are turned on while the others are turned off, the voltage wave is represented by the dotted line $V_{WL0}(2)$ whose slew rate is relatively increased; when the p-channel MOSFETs 6141, 6142 and 6143 are turned on while the rest one is turned off, the voltage wave is represented by the dotted line $V_{WL0}(3)$ whose slew rate is further increased; and so on and so forth. In an alternative embodiment, the p-channel MOSFET 6141 can be turned on in advance to achieve the confined word line driving mechanism, and then some or all of the p-channel MOSFETs 6142, 6143 and 6144 can be turned on one by one or in a predetermined order to increase the rate of reading data. Please note that the total number of the p-channel MOSFETs in this embodiment is merely exemplary, and those of ordinary skill in the art can choose an appropriate number of transistors by referring to the present disclosure on the basis of their demands. Besides, in another embodiment (as shown in FIG. 7), the random access memory 600 may further comprise: a voltage adjusting unit 620 including a switch module 612 with a p-channel MOSFET 6211 and a capacitor 622. The detail of the voltage adjusting unit 620 can be found in the preceding paragraphs such as the disclosure about voltage adjusting unit in FIG. 1 through FIG. 5. Since people of ordinary skill in the art can appreciate the detail and modification of the embodiment of FIG. 7 by referring to the aforementioned embodiments, repeated and redundant explanation is therefore omitted. It should be noted that although the aforementioned switch module is carried out with a transistor, it might be carried out with other known techniques.

Figure 8:
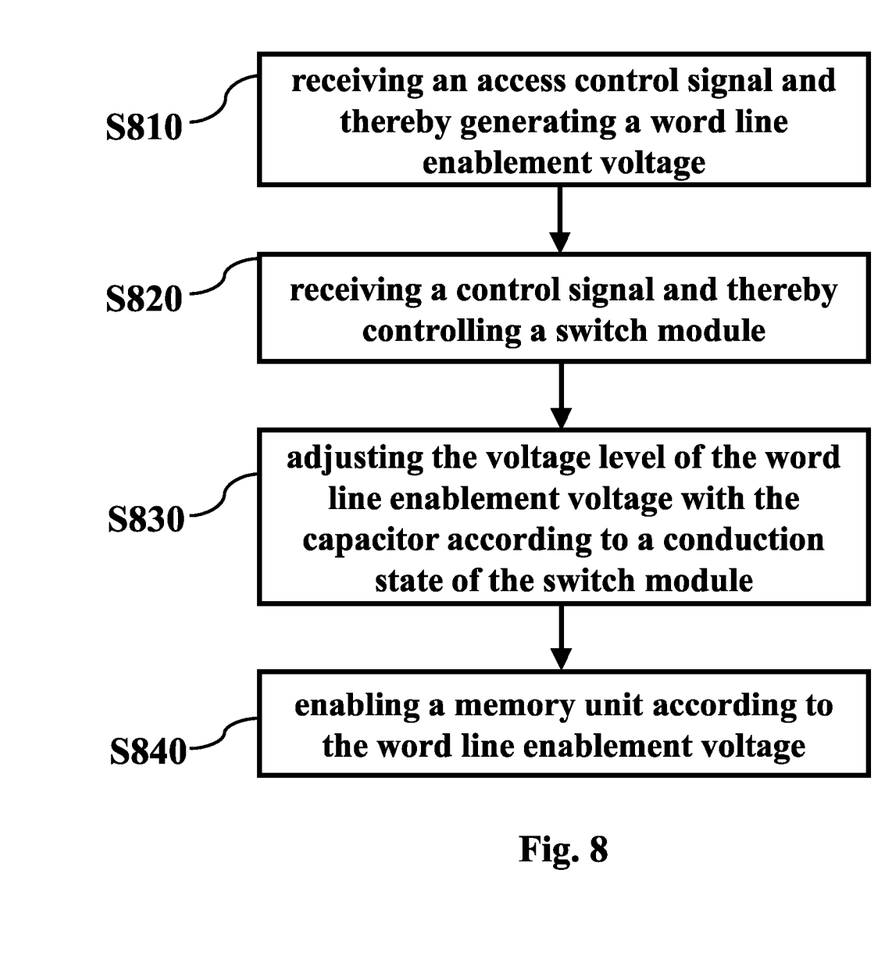
FIG. 8 illustrates an embodiment of the memory access method of the present invention.

The present invention also discloses a memory access method which can be executed with the random access memory 100 of FIG. 1 or the equivalent thereof. The detail and modification of this method that can be found in or derived from the embodiments of the aforementioned device invention is omitted. As it is shown in FIG. 8, an embodiment of this memory access method comprises the following steps:

Step S810: receiving an access control signal (e.g., the aforementioned signal A0) and thereby generating a word line enablement voltage (e.g., the aforementioned voltage $V_{WL0}$);

Step S820: receiving a control signal (e.g., the aforementioned signal CTL0) and thereby controlling a switch module (e.g., the aforementioned switch module 121) which is coupled with a capacitor (e.g., the aforementioned capacitor 122);

Step S830: adjusting the voltage level of the word line enablement voltage with the capacitor according to a conduction state of the switch module; and Step S840: enabling a memory unit (e.g., the aforementioned memory unit 130) according to the word line enablement voltage, wherein the word line enablement voltage, the switch module and the memory unit are associated with the same word line (e.g., the aforementioned word line WL0). In an alternative embodiment, the method further comprises: receiving another access control signal (e.g., the aforementioned access control signal A1) to generate another word line enablement voltage (e.g., the aforementioned voltage $V_{WL1}$); receiving another control signal (e.g., the aforementioned control signal CTL1) to thereby control another switch module (e.g., the aforementioned switch module 151) which is also coupled with the capacitor of step S820; and adjusting the voltage level of the said another word line enablement voltage with the capacitor according to a conduction state of the said another switch module; and enabling another memory unit (e.g., the aforementioned memory unit 160) according to the said another word line enablement voltage, wherein the said another word line enablement voltage, the said another switch module and the said another memory unit are associated with another word line (e.g., the aforementioned word line WL1).

In summary, the embodiments of the random access memory and the memory access method of the present invention make use of a voltage adjusting unit and a word line driving unit to adjust a word line enablement voltage for enabling a memory unit, so as to achieve the confined word line driving mechanism and reduce read disturbance. Compared with the prior art, the present invention can modify a word line enablement voltage flexibly, and maintain the rate of reading data from memories, so that the data reading rate does not substantially slow down as the word line enablement voltage gets lower.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A random access memory, comprising:
a first word line;
a first word line driving unit, coupled to the first word line, operable to receive a first access control signal and thereby generate a first word line enablement voltage;
a first voltage adjusting unit operable to have a first voltage level and a second voltage level appear on the first word line in a single operation of the random access memory, wherein the first voltage level appears on the first word line before the second voltage level does, and the first voltage level is lower than the second voltage level, the first voltage adjusting unit comprises:
a first switch module, coupled to the first word line, operable to receive a first control signal and thereby determine a conduction state of the first switch module; and
a capacitor, coupled to the first switch module, operable to adjust a voltage level of the first word line enablement voltage according to the conduction state of the first switch module; and
a first memory unit, coupled to the first word line, operable to be enabled in accordance with the first word line enablement voltage.

2. The random access memory of claim 1, further comprising:
a second word line;
a second word line driving unit, coupled to the second word line, operable to receive a second access control signal and thereby generate a second word line enablement voltage;
a second voltage adjusting unit including:

a second switch module, coupled to the second word line and the capacitor, operable to receive a second control signal and thereby determine a conduction state of the second switch module, while the capacitor is operable to adjust a voltage level of the second word line enablement voltage according to the conduction state of the second switch module; and a second memory unit, coupled to the second word line, operable to be enabled in accordance with the second word line enablement voltage.

3. The random access memory of claim 1, wherein the first switch module includes a first transistor; when the first control signal is at a first voltage level, the first transistor is turned on while the capacitor is coupled to the first word line to make the first word line enablement voltage lower down; and when the first control signal is at a second voltage level, the first transistor is turned off while the capacitor is decoupled from the first word line to make the first word line enablement voltage rise up.

4. The random access memory of claim 1, wherein the first word line driving unit includes:
an inverter having an input end operable to receive the first access control signal and an output end operable to output the first word line enablement voltage, and the inverter including:
a p-channel transistor having a source terminal coupled with a first voltage source; and
an n-channel transistor having a source terminal coupled with a second voltage source,
wherein a gate terminal of the p-channel transistor and a gate terminal of the n-channel transistor are coupled with each other to be the input end, a drain terminal of the p-channel transistor and a drain terminal of the n-channel transistor are coupled with each other to be the output end, and a voltage level of the first voltage source is higher than a voltage level of the second voltage source.

5. The random access memory of claim 4, wherein the first word line driving unit further includes:
at least one additional n-channel transistor having a drain terminal coupled with a high voltage source and a source terminal coupled with a gate terminal of the at least one additional n-channel transistor to be a node; and
a plurality of additional p-channel transistors coupled with the at least one additional n-channel transistor in parallel between the high voltage source and the node, wherein the node is coupled to a power input end of the inverter and operable to provide an operation voltage for the inverter, and the plurality of additional p-channel transistors is operable to receive a plurality of control signals respectively and thereby be turned on or off according to the plurality of control signals, so as to control a voltage level of the operation voltage and control the first word line enablement voltage consequently.

6. The random access memory of claim 5, further comprising:
a detecting unit operable to detect data inversion of the first memory unit caused by read disturbance and thereby generate a detection result, and the detecting unit operable to control or adjust a conduction state of the plurality of additional p-channel transistors according to the detection result through the plurality of control signals, so as to adjust the voltage level of the first word line enablement voltage and a rising speed of the voltage level of the first word line enablement voltage.

7. The random access memory of claim 1, wherein the first word line driving unit includes:
a first p-channel transistor having a source terminal coupled with a first voltage source;
an n-channel transistor having a source terminal coupled with a second voltage source while a voltage level of the first voltage source is higher than a voltage level of the second voltage source; and
a plurality of p-channel transistors coupled in parallel between a drain terminal of the first p-channel transistor and a drain terminal of the n-channel transistor,
wherein one of the plurality of p-channel transistors receives the first access control signal, and the others of the plurality of p-channel transistors receive a plurality of control signals respectively and are turned on or off respectively in accordance with the plurality of control signals to thereby control a slew rate of the first word line enablement voltage.

8. The random access memory of claim 7, further comprising:
a detecting unit operable to detect data inversion of the first memory unit caused by read disturbance and thereby generate a detection result, and the detecting unit operable to adjust a conduction state of the plurality of p-channel transistors according to the detection result through the plurality of control signals, so as to adjust the voltage level of the first word line enablement voltage and a rising speed of the voltage level of the first word line enablement voltage.

9. The random access memory of claim 1, wherein an adjustment degree of the first word line enablement voltage is determined in accordance with at least one of a capacitance value of the capacitor and a resistance value of the first switch module.

10. The random access memory of claim 1, further comprising:
a detecting unit operable to detect data inversion of the first memory unit caused by read disturbance and thereby generate a detection result, and the detecting unit operable to adjust a resistance value of the first switch module or a capacitance value of the capacitor according to the detection result.

11. A memory access method carried out by a random access memory, comprising the following steps:
receiving a first access control signal and thereby generating a first word line enablement voltage;
receiving a first control signal and thereby controlling a first switch module which is coupled with a capacitor;
adjusting the first word line enablement voltage to have a first voltage level and a second voltage level with the capacitor according to a conduction state of the first switch module, wherein the first word line enablement voltage has the first voltage level and then the second voltage level in a single operation of the random access memory, and the first voltage level is lower than the second voltage level; and
enabling a first memory unit according to the first word line enablement voltage,
wherein the first word line enablement voltage, the first switch module and the first memory unit are associated with a first word line.

12. The memory access method of claim 11, further comprising:

receiving a second access control signal and thereby generating a second word line enablement voltage;

receiving a second control signal and thereby controlling a second switch module which is coupled with the capacitor;

adjusting a voltage level of the second word line enablement voltage with the capacitor according to a conduction state of the second switch module; and enabling a second memory unit according to the second word line enablement voltage, wherein the second word line enablement voltage, the second switch module and the second memory unit are associated with a second word line.

13. The memory access method of claim 11, wherein the step of adjusting the voltage level of the first word line enablement voltage includes:

determining an adjustment degree of the first word line enablement voltage according to at least one of a capacitance value of the capacitor and a resistance value of the first switch module.

14. The memory access method of claim 11, further comprising:

detecting data inversion of the first memory unit caused by read disturbance and thereby generating a detection result, and then adjusting a resistance value of the first switch module or a capacitance value of the capacitor according to the detection result.

* * * * *